United States Patent [19]

Sekino et al.

[11] Patent Number: 4,559,522

[45] Date of Patent: Dec. 17, 1985

[54] LATCHED COMPARATOR CIRCUIT

[75] Inventors: Takeo Sekino; Masashi Takeda, both of Kanagawa, Japan

[73] Assignee: Sony Corporation, Tokyo, Japan

[21] Appl. No.: 564,203

[22] Filed: Dec. 22, 1983

[30] Foreign Application Priority Data

Dec. 24, 1982 [JP] Japan .............................. 57-232261
Dec. 27, 1982 [JP] Japan .............................. 57-230600

[51] Int. Cl.⁴ .............................................. H03K 13/175
[52] U.S. Cl. ........................ 340/347 AD; 340/347 M; 307/361; 328/151
[58] Field of Search .................. 340/347 AD, 347 M; 328/151; 307/360, 361

[56] References Cited

U.S. PATENT DOCUMENTS

| | | | |
|---|---|---|---|
| 4,183,016 | 1/1980 | Sawagata | 340/347 AD |
| 4,214,232 | 7/1980 | Shaw et al. | 340/347 AD |
| 4,232,302 | 11/1980 | Jagatich | 340/347 AD |
| 4,393,371 | 7/1983 | Smith | 340/347 AD |
| 4,496,935 | 1/1985 | Inoue et al. | 340/347 AD |

Primary Examiner—B. Dobeck
Attorney, Agent, or Firm—Lewis H. Eslinger; Alvin Sinderbrand

[57] ABSTRACT

A latched comparator circuit is disclosed in which a voltage comparator circuit of a differential construction composing a part of the latched comparator circuit is substituted for by a plurality of differential amplifying circuits connected in parallel to the prior stage thereof and which are supplied with a differential input. Also, there is disclosed a latched comparator circuit in which a voltage comparator circuit of a differential construction composing a part of the latched comparator circuit is substituted for by a plurality of differential amplifying circuits connected in parallel to the prior stage thereof that are supplied with a differential input for voltage comparison and in which a switching circuit is provided between the differential amplifying circuits and a latch circuit for electrically separating both of them upon latch operation.

11 Claims, 11 Drawing Figures

FIG. 6

| P₃ | P₂ | P₁ | P₀ | D₃ | D₂ |
|---|---|---|---|---|---|
| L | L | L | H | 0 | 0 |
| L | L | H | L | 0 | 1 |
| L | H | L | L | 1 | 0 |
| H | L | L | L | 1 | 1 |

① second row, ② third row

FIG. 7

| D₂ | B₃ | B₂ | B₁ | D₁ | D₀ |
|---|---|---|---|---|---|
| 0 | H | L | L | 0 | 0 |
| 0 | L | H | L | 0 | 1 |
| 0 | L | L | H | 1 | 0 |
| 0 | L | L | L | 1 | 1 |
| 1 | L | L | L | 0 | 0 |
| 1 | L | L | H | 0 | 1 |
| 1 | L | H | L | 1 | 0 |
| 1 | H | L | L | 1 | 1 |

② second row, ① seventh row

LATCHED COMPARATOR CIRCUIT

BACKGROUND OF THE INVENTION

1. Field of the Invention

The present invention relates generally to a latched comparator circuit and more particularly relates to a latched comparator circuit suitable for being applied to a high speed A/D (analog-to-digital) converter.

2. Description of the Prior Art

In general, a high speed analog-to-digital converter (hereinafter, referred to as an A/D converter in brief) is constructed as a parallel A/D converter shown in FIG. 1 and as a serial-to-parallel A/D converter shown in FIG. 2.

To be more concrete, the parallel A/D converter shown in FIG. 1 is for 8-bit A/D conversion and comprises 255 voltage comparators $A_1$ to $A_{255}$ in which an analog input voltage $V_{in}$ is compared with 255-step reference voltages $V_1$ to $V_{255}$, respectively. The compared outputs therefrom are all supplied to an encoder 1 from which digital outputs $D_0$ to $D_7$ of 8 bits are derived.

On the other hand, the serial-to-parallel A/D converter shown in FIG. 2 is also for use in 8-bit A/D conversion, in which the input voltage $V_{in}$ is supplied to a 4-bit parallel A/D converter 2 at the first stage which derives digital outputs $D_7$ to $D_4$ of upper 4 bits. The digital outputs $D_7$ to $D_4$ of upper 4 bits are supplied to a digital-to-analog converter (hereinafter, simply referred to as D/A converter) 3, in which they are converted to an analog voltage $V_m$. A difference voltage $V_{in}-V_m$ between the input voltage $V_{in}$ and the analog voltage $V_m$ derived from a differential amplifier 4 is supplied to a 4-bit parallel A/D converter 5 at the next stage, from which digital outputs $D_3$ to $D_0$ of lower 4 bits are derived.

But, the known parallel A/D converter shown in FIG. 1 requires $(2^n-1)$ voltage comparators to convert the analog input voltage $V_{in}$ to digital outputs of n bits, so that the number of the circuit elements are increased so much, thereby causing the chip size to become large and power consumption to be increased when the A/D converter is formed as an integrated circuit (IC).

Whereas, the known serial-to-parallel A/D converter shown in FIG. 2 requires only $(2^m+2^n-2)$ voltage comparators to convert the analog input voltage $V_{in}$ to digital outputs of $(m+n)$ bits thus resulting in the reduction of the chip size and the power consumption.

But, this serial-to-parallel A/D converter shown in FIG. 2 requires the D/A converter 3. In addition, if there exists an error between the output of the upper bit converting A/D converter 2 at the first stage and the output of the D/A converter 3, this error directly appears as a conversion error and hence an error will occur at the connected portion between the upper- and lower-bit outputs. In other words, when the analog input voltage $V_{in}$ is increased, for example, monotonically, the digital output is dipped at the point where the digital output is carried from the lower bit to the upper bit, and thereafter the digital output is not increased monotonically.

In order to remove the defects inherent in the serial-to-parallel type A/D converter, the applicant of this application has previously proposed an improved A/D converter shown in FIG. 3. The improved A/D converter omits the D/A converter 3 and the differential amplifier 4 used in the A/D converter shown in FIG. 2. The lower 4 bit A/D converter 5 is controlled by the control pulse provided on the basis of the converter output of the upper 4 bit A/D converter 2.

FIG. 4 shows a practical example of such A/D converter and in this example, 4 bit conversion is carried out. In FIG. 4, an upper 2 bit A/D converter 6 is formed of three voltage comparator circuits $M_1$ to $M_3$ and an encoder 7, while a lower 2 bit A/D converter 8 is formed of three voltage comparator circuits $N_1$ to $N_3$ and an encoder 9.

A predetermined voltage is applied across terminals 11 and 12 between which 16 voltage-dividing resistors R, each having an equal resistance value, are connected in series. Reference voltages $V_{15}$ to $V_0$ of 16 steps generated by these resistors R are divided into four groups of $V_{15}$ to $V_{12}$, $V_{11}$ to $V_8$, $V_7$ to $V_4$ and $V_3$ to $V_0$. The voltages $V_{12}$, $V_8$, $V_4$ (and $V_0$), each of which represents each group are compared in voltage with the analog input voltage $V_{in}$ and then upper 2 bits, $D_3$ and $D_2$ in the digital output are produced. In correspondence with the upper 2 bits $D_3$ and $D_2$, the voltage groups $V_k$ to $V_{k-3}$ (k=15, 11 and 7) are selected. And, the voltages $V_k$ to $V_{k-3}$ of the selected groups are compared in voltage with the analog input voltage $V_{in}$ and then lower 2 bits $D_1$ and $D_0$ of the digital output are produced.

The voltage groups $V_k$ to $V_{k-3}$ are selected by the encoder 7, more particularly, outputs $P_3$ to $P_1$ are supplied thereto from the voltage comparator circuits $M_1$ to $M_3$. In order to supply the selected voltage groups to the lower 2 bit converting voltage comparator circuits $N_1$ to $N_3$, there are provided differential switches SW as shown in FIG. 4. The switch SW is formed of a differential amplifier.

FIG. 5 shows a practical example of the serial-to-parallel type A/D converter including the differential switches SW. FIG. 5 is formed of FIGS. 5A and 5B for the sake of clarity. Each of the comparator circuits $M_3$ to $M_1$ is constructed such that the emitters of transistors $Q_{m1}$ and $Q_{m2}$ are connected together to a constant current source $S_m$, while each of the comparator circuits $N_3$ to $N_1$ is constructed such that the emitters of transistors $Q_{n1}$ and $Q_{n2}$ are connected together to a constant current source $S_n$.

Each of the differential switches SW is formed of a voltage comparator circuit $A_{ij}$ (where i is equal to the number from 4 to 1 and j is equal to the number from 3 to 1). Each of the voltage comparator circuits $A_{ij}$ is constructed such that the emitters of transistors $Q_1$ and $Q_2$ are connected together to the collector of a current switching transistor $Q_3$. Inherently, the voltage comparator circuits $A_{i3}$ to $A_{i1}$ respectively operate as the first-stage of the comparator circuits $N_3$ to $N_1$.

Of these 16-step reference voltages $V_{15}$ to $V_0$, the voltages $V_{12}$, $V_8$ and $V_4$ of every other four steps are respectively supplied to the bases of the transistors $Q_{m1}$ in the comparator circuits $M_3$ to $M_1$, and the voltages $V_{15}$ to $V_{13}$ and $V_7$ to $V_5$ are respectively supplied to the bases of the transistors $Q_2$ in the comparator circuits $A_{4j}$ and $A_{2j}$. The remaining voltages $V_9$ to $V_{11}$ and $V_1$ to $V_3$ are respectively supplied to the bases of the transistors $Q_1$ of the comparator circuits $A_{3j}$ and $A_{1j}$. Further, to the bases of the transistors $Q_{m2}$ of the comparator circuits $M_3$ to $M_1$ and to the bases of the transistors $Q_1$ or $Q_2$ of the voltage comparator circuits $A_{ij}$, which are not yet supplied with the voltages $V_{15}$ to $V_1$, is supplied the analog input voltage $V_{in}$.

The collector output $P_3$ of the transistor $Q_{ml}$ in the comparator circuit $M_3$ is supplied to the bases of the transistors $Q_3$ of the voltage comparator circuit $A_{4j}$. A wired-AND output $P_2$ between the outputs of the transistor $Q_{m2}$ in the comparator circuit $M_3$ and the transistor $Q_{m1}$ in the comparator circuit $M_2$ is supplied to the bases of the transistors $Q_3$ of the comparator $A_{3j}$. While a wired-AND output $P_1$ between the outputs of the transistor $Q_{m2}$ of the comparator circuit $M_2$ and the transistor $Q_{m1}$ in the comparator circuit $M_1$ is supplied to the bases of the transistors $Q_3$ in the comparator circuits $A_{2j}$, the collector output $P_0$ of the transistor $Q_{m2}$ in the comparator circuit $M_1$ is supplied to the bases of the transistors $Q_3$ in the comparator circuits $A_{1j}$.

The emitters of the transistors $Q_3$ in the comparator circuits $A_{i3}$ to $A_{i1}$ are connected to constant current sources $S_3$, $S_2$ and $S_1$ commonly. Also, the outputs $P_3$ to $P_1$ of the comparator circuits $M_3$ to $M_1$ are supplied to the upper bit encoder 7 which derives upper 2 bits $D_3$ and $D_2$ of the digital outputs.

Moreover, the collector of the transistors $Q_1$ and $Q_2$ of the comparator circuits $A_{i3}$ to $A_{i1}$ are respectively connected to the bases of the transistors $Q_{n1}$ and $Q_{n2}$ in the comparator circuits $N_3$ to $N_1$ commonly. A collector output $B_3$ of the transistor $Q_{n1}$ in the comparator circuit $N_3$, a wired-AND output $B_2$ between the outputs of the transistor $Q_{n2}$ in the comparator circuit $N_3$ and the transistor $Q_{n1}$ in the comparator circuit $N_2$ and a wired-AND output $B_1$ between the outputs of the transistor $Q_{n2}$ in the comparator circuit $N_2$ and the transistor $Q_{n1}$ in the comparator circuit $N_1$ are all supplied to the lower bit encoder 9 which is supplied with the bit $D_2$ from the encoder 7, so that the encoder 9 produces lower 2 bits $D_1$ and $D_0$ of the digital outputs. The following are examples of circuit operation wherein truth tables of the encoders 7 and 9 are shown in FIGS. 6 and 7.

With the arrangement thus formed, as, for example, shown by a point ① in FIGS. 5A and 5B, let it be assumed that the analog input voltage $V_{in}$ is less than the reference voltage $V_7$ and greater than the reference voltage $V_6$ ($V_7 > V_{in} > V_6$) (hereinafter, corresponding to the above point ①, characters "H" and "L", both showing the level of the signal are suffixed with 1 as in "$H_1$" and "$L_1$".).

Then, since the analog input voltage $V_{in}$ is less than the reference voltage $V_8$ and further less than the reference voltage $V_{12}$ ($V_{12} > V_8 > V_{in}$), the bases of the transistors $Q_{m1}$ in the comparator circuits $M_3$ and $M_2$ become "$H_1$" and the bases of the transistors $Q_{m2}$ thereof becomes "$L_1$", so that the collectors of the transistors $Q_{m1}$ thereof become "$L_1$" and the collectors of the transistors $Q_{m2}$ thereof become "$H_1$". Also, since the analog input voltage $V_{in}$ is greater than the reference voltage $V_4$ ($V_{in} > V_4$), the base of the transistor $Q_{m1}$ in the comparator circuit $M_1$ becomes "$L_1$" and the base of the transistor $Q_{m2}$ thereof becomes "$H_1$" so that the collector of its transistor $Q_{m1}$ becomes "$H_1$" and the collector of its transistor $Q_{m2}$ becomes "$L_1$". Accordingly, since the collector output $P_3$ is equal to "$L_1$", the collector output $P_2$ is equal to "$L_1$", the collector output $P_1$ is equal to "$H_1$" and the collector output $P_0$ is equal to "$L_1$" ($P_3$="$L_1$", $P_2$="$L_1$", $P_1$="$H_1$" and $P_0$="$L_1$"), from the truth table of FIG. 6, the bit $D_3$ is equal to "0" and the bit $D_2$ is equal to "1" ($D_3$="0" and $D_2$="1").

Whereas, since the collector output $P_3$ is equal to "$L_1$", the collector output $P_2$ is equal to "$L_1$", the collector output $P_1$ is equal to "$H_1$" and the collector output $P_0$ is equal to "$L_1$" ($P_3$="$L_1$", $P_2$="$L_1$", $P_1$="$H_1$" and $P_0$="$L_1$"), only the transistors $Q_3$ of the comparator $A_{2j}$ are made ON, so that the analog input voltage $V_{in}$ is compared with the reference voltages $V_7$ to $V_5$ in the comparator circuits $A_{2j}$. Since the analog input voltage $V_{in}$ is less than the reference voltage $V_7$ and is greater than the reference voltage $V_6$ ($V_7 > V_{in} > V_6$), the base of the transistor $Q_1$ of the comparator circuit $A_{23}$ becomes "$L_1$" and the base of the transistor $Q_2$ thereof becomes "$H_1$" so that the collector of its transistor $Q_1$ becomes "$H_1$" and the collector of its transistor $Q_2$ becomes "$L_1$". Likewise, while the bases of the transistors $Q_1$ in the comparator circuits $A_{22}$ and $A_{21}$ become "$H_1$" and the bases of the transistor $Q_2$ thereof become "$L_1$", the collectors of the transistors $Q_1$ thereof become "$L_1$" and the collectors of the transistors $Q_2$ thereof become "$H_1$".

Since these outputs are supplied to the comparator circuits $N_3$ to $N_1$, the collector of the transistor $Q_{n1}$ in the comparator circuit $N_3$ becomes "$L_1$" and the collector of the transistor $Q_{n2}$ thereof becomes "$H_1$", while the collectors of the transistors $Q_{n1}$ in the comparator circuits $N_2$ and $N_1$ become both "$H_1$" and the collectors of the transistors $Q_{n2}$ thereof become "$L_1$". Accordingly, the collector output $B_3$ is equal to "$L_1$", the collector output $B_2$ is equal to "$H_1$" and the collector output $B_1$ is equal to "$L_1$" ($B_3$="$L_1$", $B_2$="$H_1$" and $B_1$="$L_1$") and at the same time, the bit $D_2$ is equal to "1" ($D_2$="1"). Therefore, from the truth table of FIG. 7, the bit $D_1$ is equal to "1" and the bit $D_0$ is equal to "0" ($D_1$="1" and $D_0$="0").

Therefore, when the analog input voltage $V_{in}$ is less than the reference voltage $V_7$ and is greater than the reference voltage $V_6$ ($V_7 > V_{in} > V_6$) as shown by the point ①, the digital outputs $D_3$ to $D_0$ thus obtained are represented by "0 1 1 0". When the analog input voltage $V_{in}$ at this time whose fractions are omitted is quantized, it has the level of 6th step counting from the grounded side (the grounded electric potential is numbered as 0th step). Thus since 6 is represented as "0 1 1 0", the digital outputs $D_3$ to $D_0$ are equal to "0 1 1 0" ($D_3$ to $D_0$="0 1 1 0") so that they are the correct digital outputs.

As shown, for example, by a point ② in FIG. 5A, let it be assumed that the analog input voltage $V_{in}$ is less than the reference voltage $V_{10}$ and is greater than the reference voltage $V_9$ ($V_{10} > V_{in} > V_9$) (hereinafter, characters "H" and "L" indicating the level of the signal are suffixed by "2" in response to the point ②).

Then, since the analog input voltage $V_{in}$ is less than the reference voltage $V_{12}$ ($V_{12} > V_{in}$), the base of the transistor $Q_{m1}$ in the comparator circuit $M_3$ becomes "$H_2$" and the base of the transistor $Q_{m2}$ thereof becomes "$L_2$" so that the collector of the transistor $Q_{m1}$ thereof becomes "$L_2$" and the collector of the transistor $Q_{m2}$ thereof becomes "$H_2$". In addition, since the analog input voltage $V_{in}$ is greater than the reference voltage $V_4$ and is further greater than the reference voltage $V_8$ ($V_{in} > V_8 > V_4$), the bases of the transistors $Q_{m1}$ in the comparator circuits $M_2$ and $M_1$ become "$L_2$" and the bases of the transistors $Q_{m2}$ thereof become "$H_2$", so that the collectors of the transistor $Q_{m1}$ thereof become "$H_2$" and the collectors of the transistors $Q_{m2}$ become "$L_2$". Therefore, since the collector output $P_3$ is equal to "$L_2$", the collector output $P_2$ is equal to "$H_2$", the collector output $P_1$ is equal to "$L_2$" and the collector output $P_0$ is equal to "$L_2$" ($P_3$="$L_2$", $P_2$="$H_2$", $P_1$="$L_2$" and $P_0$="$L_2$"), from the truth table of FIG.

6, the digital output $D_3$ is equal to "1" and the digital output $D_2$ is equal to "0" ($D_3$="1" and $D_2$="0").

Because the collector output $P_3$ is equal to "$L_2$", the collector output $P_2$ is equal to "$H_2$", the collector output $P_1$ is equal to "$L_2$" and the collector output $P_0$ is equal to "$L_2$" ($P_3$="$L_2$", $P_2$="$H_2$", $P_1$="$L_2$" and $P_0$="$L_2$"), only the transistors $Q_3$ in the comparator circuit $A_{3j}$ are made ON, so that the input voltage $V_{in}$ is compared with the reference voltages $V_9$ to $V_{11}$ in the comparator circuit $A_{j3}$. Since the input voltage $V_{in}$ is greater than the reference voltage $V_9$ and is less than the reference voltage $V_{10}$ ($V_9 < V_{in} < V_{10}$), the base of the transistor $Q_1$ of the comparator circuit $A_{33}$ becomes "$L_2$" and the base of the transistor $Q_2$ thereof becomes "$H_2$" so that the collector of the transistor $Q_1$ thereof becomes "$H_2$" and the collector of the transistor $Q_2$ thereof becomes "$L_2$". Thus, at the same time, the bases of the transistors $Q_1$ in the comparator circuits $A_{32}$ and $A_{31}$ become both "$H_2$" and the bases of the transistors $Q_2$ thereof become both "$L_2$", so that the collectors of the transistors $Q_1$ become "$L_2$" and the collectors of the transistors $Q_2$ become "$H_2$".

Since these outputs are supplied to the comparator circuits $N_3$ to $N_1$, while the collector of the transistor $Q_{n1}$ in the comparator circuit $N_3$ becomes "$L_2$" and the collector of the transistor $Q_{n2}$ thereof becomes "$H_2$", the collectors of the transistors $Q_{n1}$ in the comparator circuits $N_2$ and $N_1$ become "$H_2$" and the collectors of the transistors $Q_{n2}$ thereof become "$L_2$". Therefore, since the output $B_3$ is equal to "$L_2$", the output $B_2$ is equal to "$H_2$" and the output $B_1$ is equal to "$L_2$" ($B_3$=$L_2$", $B_2$="$H_2$" and $B_1$="$L_2$") and also the digital output $D_2$ is equal to "0" ($D_2$="0"), from the truth table of FIG. 7, the digital output $D_1$ is equal to "0" ($D_1$="0") and the digital output $D_0$ is equal to "1" ($D_0$="1").

Accordingly, when the analog input voltage $V_{in}$ is less than the reference voltage $V_{10}$ and is greater than the reference voltage $V_9$ ($V_{10} > V_{in} > V_9$) as shown by the point ②, the digital outputs $D_3$ to $D_0$ become such as represented by "1 0 0 1". If the input voltage $V_{in}$ at that time whose fractions are omitted is quantized, it has the level of 9th step counting from the grounded side. In this case, 9 is equal to "1 0 0 1" (9="1 0 0 1"), so that the digital outputs $D_3$ to $D_0$ are equal to "1 0 0 1" (9="1 0 0 1"), proving that they are the correct digital outputs.

By the way, when the comparator circuits $N_3$ to $N_1$ provided in the lower 2 bit A/D converter 8 are not constructed by only the differential amplifiers as mentioned above but constructed in such a manner that the compared outputs $B_3$ to $B_1$, which are the outputs from the differential amplifiers, are latched once or temporarily and the latched outputs are then supplied to the encoder 9, instead of the comparator circuits $N_3$ to $N_1$, latched comparators are used.

FIG. 8 is a connection diagram showing an example of the latched comparator circuit, which corresponds to the comparator circuit $N_2$. In FIG. 8, the same reference numerals as those in FIG. 5 designate the same elements. In FIG. 8, reference numeral 20 generally designates the latched comparator circuit in which there is provided in addition to the voltage comparator circuit $N_2$, a latch circuit 21 for latching the output of the comparator circuit $N_2$.

The latch circuit 21 includes a pair of transistors Qa and Qb in which the emitters thereof are connected common, in which the base of one transistor is connected to the collector of the other transistor and vice versa. The collector output (compared output)$B_2$ of the transistor $Q_{n1}$ in the comparator circuit $N_2$ is supplied to the base of one transistor Qb, while the other collector output $B_1$ is supplied to the base of the other transistor Qa.

The comparator circuit $N_2$ and the latch circuit 21 are controlled complementarily in their operations. To this end, there is provided a switching differential amplifier 22 formed of a pair of transistors Qc and Qd which is controlled in switching operation in response to pulses Pc and $\overline{Pc}$ (each of which is synchronized with the sampling pulse) to be respectively supplied to the transistors Qc and Qd. Reference numeral 23 designates a current source and Ra and $R_L$ collector resistors of the voltage comparator circuit $A_{i2}$ and the comparator circuit $N_2$, respectively.

With the above construction thus made, when the pulse Pc is at high level, the comparing operation is carried out in the latched comparator circuit 20, while when the pulse Pc is at low level, the compared output is latched therein.

When the latched comparator circuit 20 is used as described above, after the input voltage $V_{in}$ and the reference voltage $V_n$ are compared in voltage by the voltage comparator circuits $A_{i2}$, the voltage comparing operation is carried out by the comparator circuit $N_2$. As a result, the compared outputs $B_1$ and $B_2$ are delayed by the time necessary for the comparing operation in the comparator circuit $N_2$ at the succeeding stage. Thus, the sampling period of the A/D converter can not be made fast and hence the high speed A/D conversion is prevented.

In addition, when a DC offset exists in the comparator circuit $N_2$ which serves as the last stage differential amplifying section for the encoder 9, since there is generally provided no means which can adjust the DC offset, the accuracy of the A/D conversion becomes poor.

OBJECTS AND SUMMARY OF THE INVENTION

It is an object of the present invention to provide an improved latched comparator circuit.

It is another object of the present invention to provide a latched comparator circuit by which an analog-to-digital conversion can be performed at high speed and the accuracy of the analog-to-digital conversion can be improved.

It is still another object of the present invention to provide a latched comparator circuit of a simple construction which can remove the fluctuation of outputs caused when the circuit construction is made common.

It is a further object of the present invention to provide a latched comparator circuit in which a voltage comparator circuit of a differential construction constituting a part of the latched comparator circuit is substituted with a plurality of differential amplifier circuits connected in parallel at the prior stage of the latched comparator circuit and to which a differential input is supplied.

It is yet a further object of the present invention to provide a latched comparator circuit in which a voltage comparator circuit used as the comparator circuit of a latched comparator circuit and a latch circuit are electrically disconnected upon latch operation to avoid output fluctuation after the latching operation.

According to one aspect of the present invention, there is provided a latched comparator circuit in which a voltage comparing operation and a latch operation are repeatedly carried out at every sampling period comprising:

a plurality of voltage comparators supplied with one analog input signal commonly and a plurality of different reference voltages respectively, one of said plurality of voltage comparators being selected at every sampling period and output terminals of said voltage comparators being connected common; and a latch circuit directly supplied with a common output of said plurality of voltage comparators and carrying out a latch operation in synchronism with a sampling period, and output terminal of said latch circuit being commonly connected to said voltage comparators and also being connected through a resistor to a power source.

The other objects, features and advantages of the present invention will become apparent from the following description taken in conjunction with the accompanying drawings through which the like references designate the same elements and parts.

BRIEF DESCRIPTION OF THE DRAWINGS

FIGS. 6 and 7 are respectively truth tables of an encoder used in the A/D converter shown in FIG. 3;

DESCRIPTION OF THE PREFERRED EMBODIMENTS

Now, an embodiment of a latched comparator circuit according to the present invention will hereinafter be described with reference to FIGS. 9 and 10, in which the same references as those in FIG. 8 designate the same elements with the case where the example of the invention is used as the comparator of the A/D converter as an example.

Figure 1:
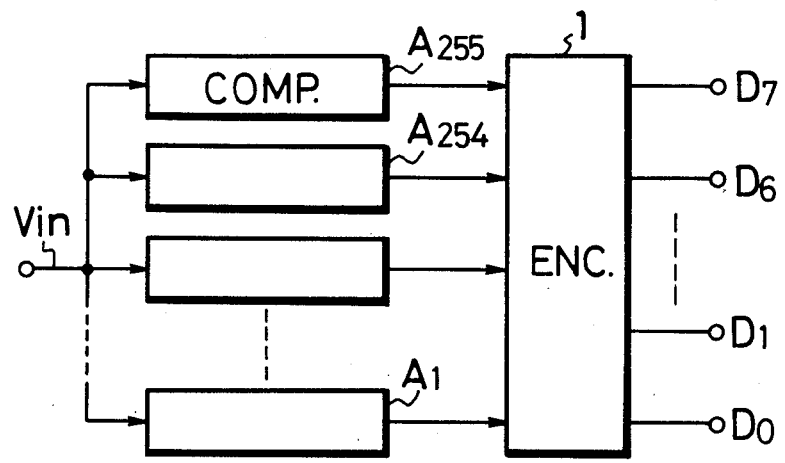
FIG. 1 is a diagram useful for explaining a conventional parallel type A/D (analog-to-digital) converter.
Figure 2:
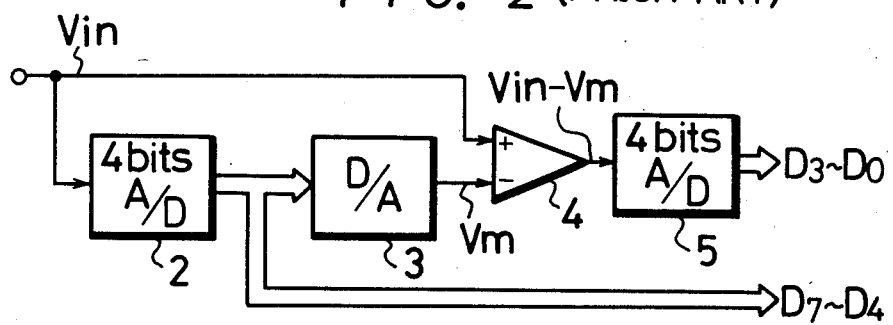
FIG. 2 is a diagram useful for explaining a conventional serial-to-parallel type A/D converter.
Figure 3:
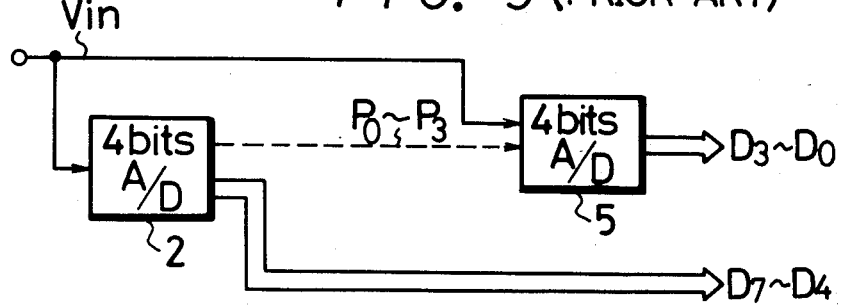
FIG. 3 is a diagram showing an example of an improved serial-to-parallel type A/D converter which is used to explain the present invention.
Figure 4:
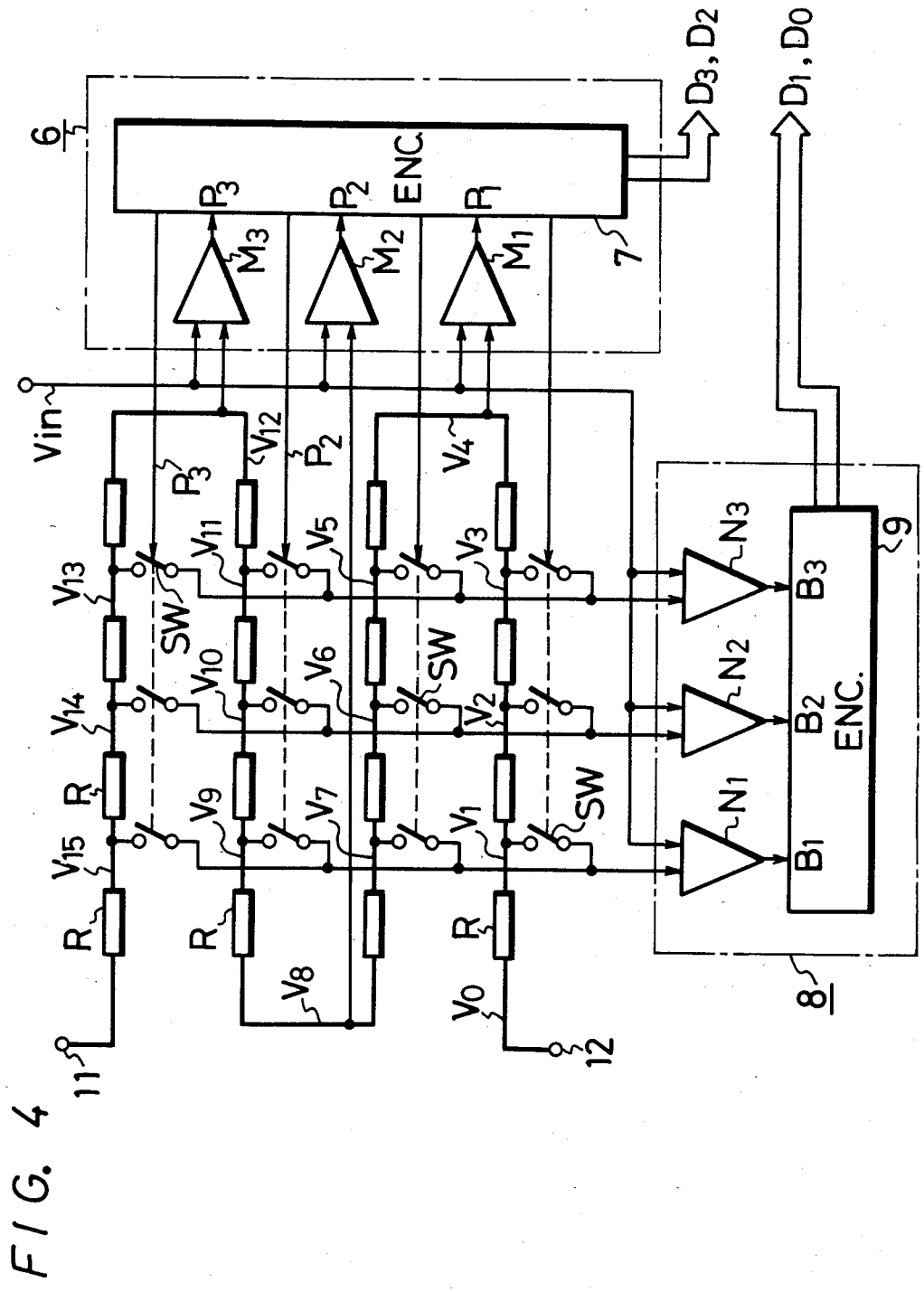
FIG. 4 is a block diagram showing a main part of a practical example thereof.
Figure 5A:
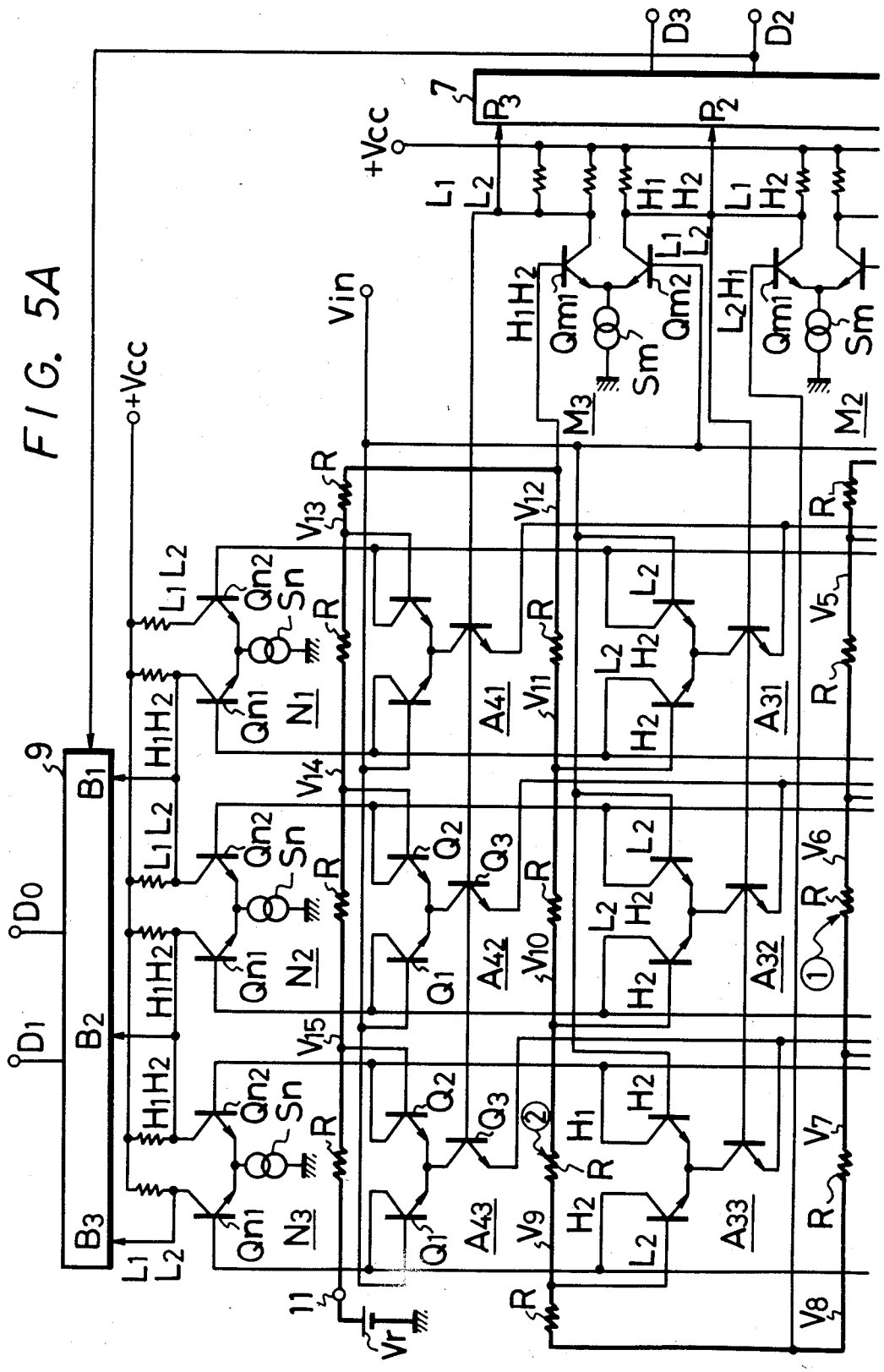
FIG. 5 (formed in FIGS. 5A and 5B) is a circuit diagram showing the construction of FIG. 4 more practically.
Figure 5B:
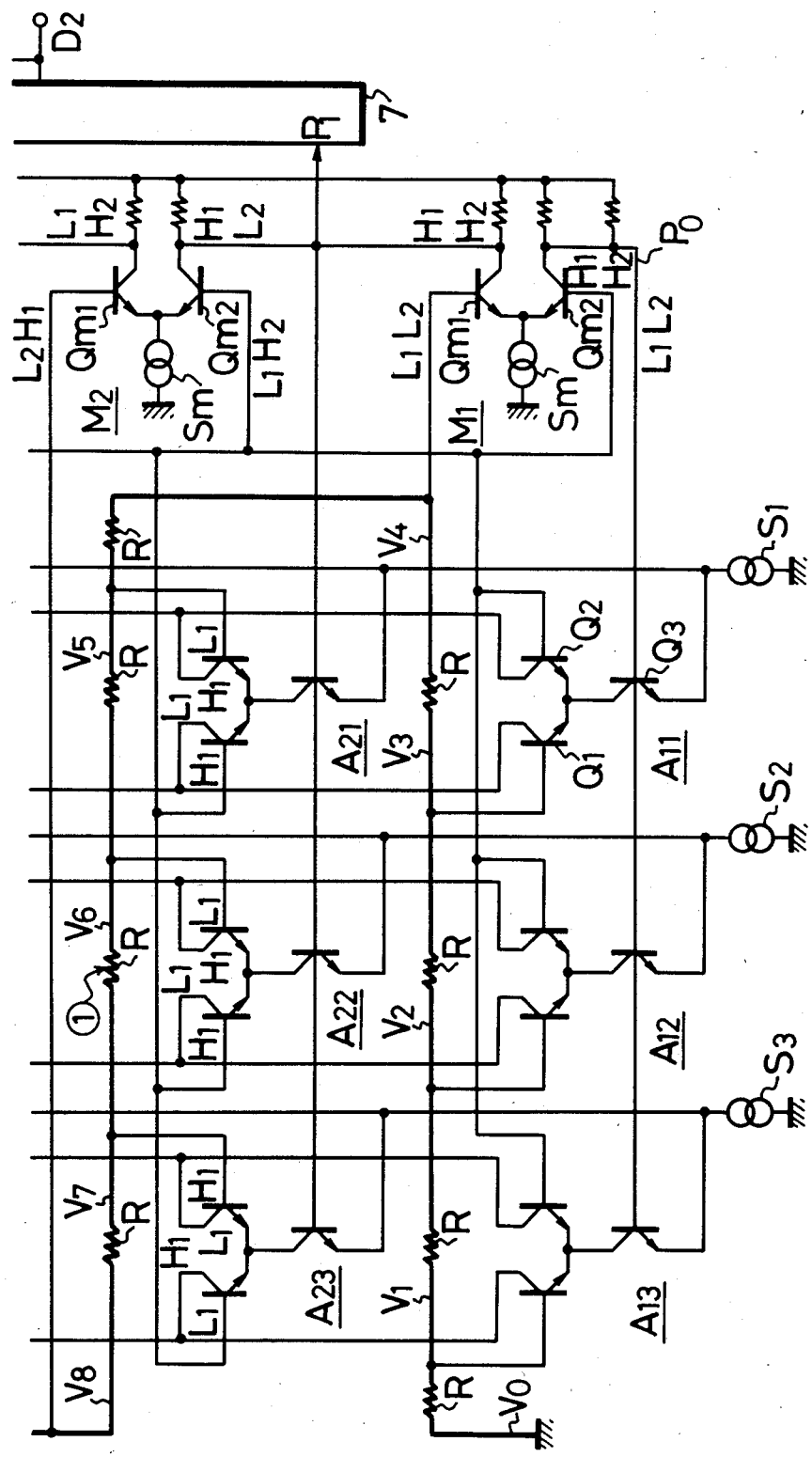
Figure 8:
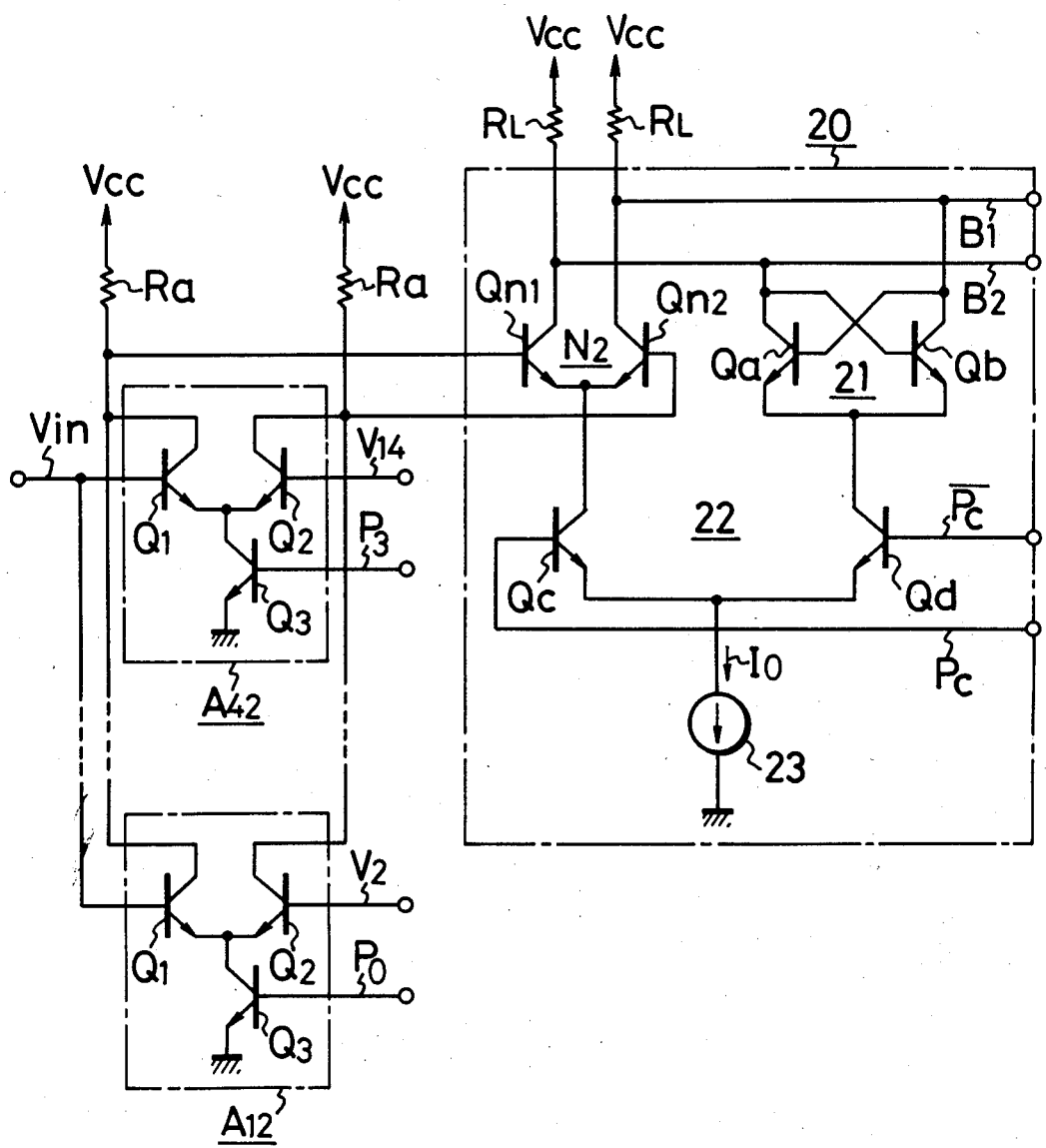
FIG. 8 is a circuit diagram of a latched comparator circuit used to explain the present invention.
Figure 9:
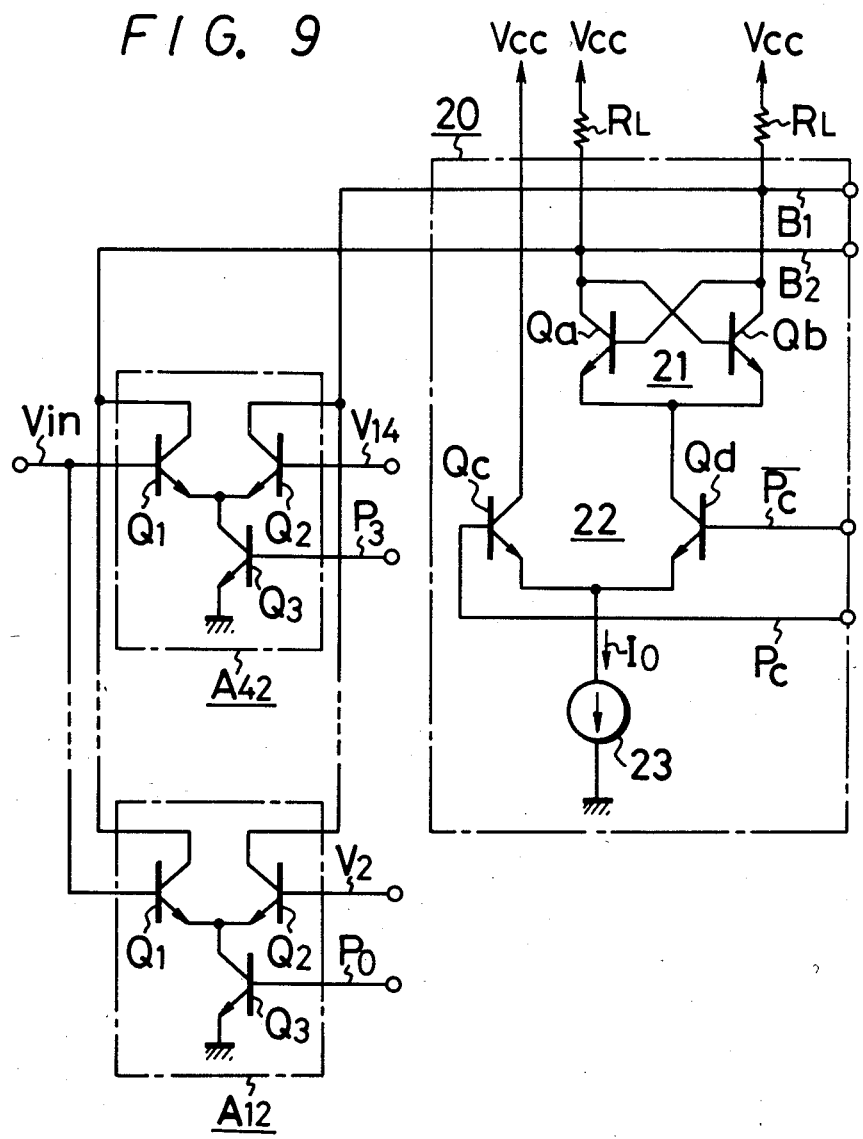
FIG. 9 is a circuit diagram showing an embodiment of a latched comparator circuit according to the present invention.

In the present invention, as shown in FIG. 9, the collector outputs of the voltage comparator circuits $A_{i2}$ are supplied to the latch circuit 21 so that the collector resistors Ra and the comparator circuit $N_2$ used in the example shown in FIG. 8 are not necessary. Thus, the collector of the transistor Qc is directly connected to a power source Vcc. The other circuit construction of this embodiment is substantially the same as that of the prior example shown in FIG. 8.

With the embodiment of the invention thus constructed, the collector outputs compared in voltage by the voltage comparator circuits $A_{i2}$ are latched in the latch circuit 21 in response to the supply of the pulse $\overline{P_C}$ thereto. Accordingly, since the comparator circuit $N_2$ is not provided, the delay time is reduced by the amount corresponding to the delay time caused by the comparator circuit $N_2$ so as to make the comparing speed high. Thus, the frequency of more than 80 MHz can be used as the sampling frequency so that the A/D conversion can be made high. Also, this latched comparator circuit of this embodiment is free from the problem of the DC offset.

When the latched comparator circuit of the invention is formed as shown in FIG. 9, a capacitance such as a collector parasitic capacitance $C_S$ between the collectors of the transistors $Q_1$ and $Q_2$ and the IC substrate, a collectorbase capacitance $C_{CB}$, further a line capacitance $C_L$ and the like is interposed in parallel to the load resistor $R_L$. Due to the time constant determined by the total capacitance thereof and the resistance value of the load resistor $R_L$, a signal delay is caused between the voltage comparator circuits $A_{i2}$ and the latch circuit 21. Particularly when a large number of voltage comparator circuits $A_{i2}$ are connected in parallel as shown in FIG. 9, the total capacitance becomes as large as the integral multiple of the number of the voltage comparator circuits $A_{i2}$ so that the time constant becomes larger and hence the delay of the signal also becomes larger.

Therefore, although the voltage comparator circuit $N_2$ is omitted from the circuitry as above so as to prevent the signal from being delayed, it can not be said that this above delay preventing measure is sufficient.

Figure 10:
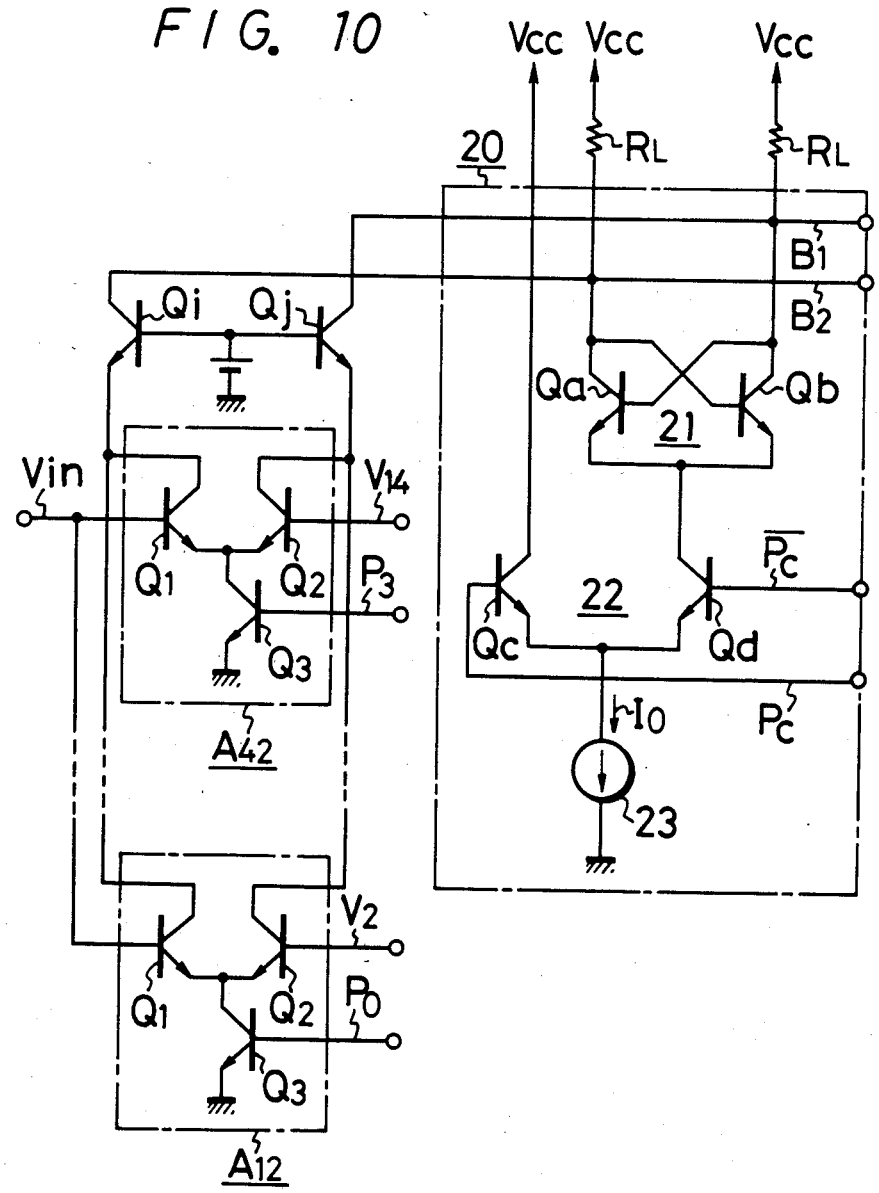
FIG. 10 is a circuit diagram showing another embodiment of the latched comparator circuit according to the present invention.

FIG. 10 shows another embodiment of the latched comparator circuit according to the present invention which is improved in view of the above aspects in which reference numerals the same as those in FIG. 9 show the same elements. In this case, transistors $Q_i$ and $Q_j$ which are connected in cascade are respectively provided for the transistors $Q_1$ and $Q_2$ constituting the voltage comparator circuits $A_{i2}$, and through these transistors $Q_i$ and $Q_j$, the differential outputs as the collector outputs are supplied to the latch circuit 21. The other circuit construction of the embodiment shown in FIG. 10 is substantially the same as that shown in FIG. 9.

With the circuitry thus made, a line time constant is determined by the emitter resistance re of the cascade-connected transistors $Q_i$ and $Q_j$ and the above total capacitance. Since the emitter resistance re is decreased in proportion to the emitter current which flows through the cascade-connected transistors $Q_i$ and $Q_j$, the condition of $re < < R_L$ is satisfied. Consequently, when the cascade-connected transistors $Q_i$ and $Q_j$ are connected as above, the influence of the load resistor $R_L$ is removed and the time constant becomes significantly small so that the delay in the signal line up to the latch circuit 21 can be improved greatly.

As described above, the delay of the signal can be improved considerably by this embodiment of the latched comparator circuit and hence it is appreciated that the higher speed than that of FIG. 9 can be carried out in A/D conversion.

While in the above description the present invention is applied to the latched comparator circuit for the high speed A/D converter, it is needless to say that the present invention can also be applied to a circuit in which a large number of differential amplifying circuits which are connected in parallel are connected to the input stage of the latched comparator circuit.

While in the above description the operation is given on the 4 bit construction, the present invention can be applied without any limitation to the bit number. While in the above embodiments the present invention is applied to the latched comparator circuit relating to the comparator circuit $N_2$, the invention can naturally be applied to the latched comparator circuit relating to the other comparator circuits $N_3$ and $N_1$.

As set forth above, according to the invention, some circuits are used common to remove the delay of the signal and to thereby make the A/D conversion operation at high speed. At the same time, the occurrence of the DC offset is reduced so that the accuracy of the A/D conversion can be improved. In addition, if the latched comparator circuit is constructed as shown in FIG. 10, the A/D conversion can be carried out at higher speed.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. A latched comparator circuit for use in converting an input analog signal to a digital signal to be supplied to inputs of a digital encoder, in which a voltage comparing operation and a latch operation are repeatedly carried out at every sampling period in response to a sampling signal, comprising
    a plurality of voltage comparators each having first and second output terminals and each supplied with said analog input signal and one of a plurality of different reference voltages, respectively, one of said plurality of voltage comparators being enabled at every sampling period of said sampling signal and said first and second output terminals, respectively, of said voltage comparators being connected in common; and
    a latch circuit having first and second input terminals respectively connected to said first and second commonly connected outputs of said plurality of voltage comparators and selectively enabled for carrying out a latch operation in response to said sampling signal, first and second output terminals of said latch circuit being respectively connected to said first and second output terminals of said voltage comparators and being connected to the inputs of said encoder.

2. A latched comparator circuit according to clam 1, wherein each of said voltage comparators is formed of a pair of transistors of the same polarity, in which base connections of each of said transistors are respectively supplied with said analog input signal and a selected one of said reference voltages and emitters of said transistors are commonly connected to ground potential through a first switching circuit, which is enabled in response to said sampling signal, whereby said voltage comparators deliver a compared result of said analog input signal with said selected reference voltage at collectors of said pairs of transistors at every sampling period of said sampling signal.

3. A latched comparator circuit according to claim 1, further comprising a constant current source, and wherein said latch circuit is formed of a pair of transistors with emitters of said pair of transistors being commonly connected, and having a base of a first transistor being connected to a collector of a second transistor of the pair and a base of the second transistor connected to a collector of the first transistor, said bases of said pair of transistors forming said first and second inputs of said latch circuit by being respectively connected to the commonly connected output terminals of said voltage comparators and said commonly connected emitters being connected to ground potential through a series circuit formed of a second switching circuit, which is switched at the sampling period, and said constant current source.

4. A latched comparator circuit according to claim 3, further comprising a power source, and wherein said second switching circuit is formed of a pair of transistors having emitters thereof commonly connected in differential construction with bases of said pair of transistors being respectively supplied with signal pulses synchronized with said sampling signal and being out of phase with respect to each other, a collector of one of said pair of transistors being connected to the common emitters of said transistors constituting said latch circuit and a collector of the other of said pair of transistors being connected to said power source.

5. A latched comparator circuit according to claim 1, wherein said commonly connected output terminals of each of said plurality of voltage comparators are connected to a pair of transistors of the same polarity connected in cascade to said inputs of said latch circuit.

6. A latched comparator circuit according to claim 2, further comprising a power source and wherein the collectors of each of said plurality of voltage comparators are commonly connected to emitters of a pair of transistors of the same polarity connected in cascade and having their bases commonly connected to said power source, and the collectors of said pair of transistors connected in cascade are respectively connected to said inputs of said latch circuit.

7. An analog-to-digital converter for converting an analog input signal to a digital signal of the kind including a resistor group formed of a plurality (n) of resistors connected in series for generating a corresponding plurality of reference voltages; a plurality of first comparator circuits each connected for comparing said analog input signal with a selected reference voltage at every M-th resistor in said resistor group, where M is 1, 2, ... n; a plurality of second voltage comparator circuits each connected for comparing said analog input signal with a reference voltage at every N-th resistor in said resistor group, where N is 1, 2, ... n; selecting means for selecting one of said outputs of said first voltage comparator circuits corresponding to one of said reference voltages which is supplied to said second voltage comparator circuit; a first encoder for forming a first digital output from the outputs of said first voltage comparator circuits; a second encoder for forming a second digital output from the outputs of said second voltage comparator circuits and mixing means for mixing said first digital output and said second digital output to produce a digital output signal corresponding to said analog input signal, wherein at least one of said plurality of first and second voltage comparator circuits is formed of a latched comparator circuit and said latched comparator circuit carries out a voltage comparing operation and a latch operation repeatedly at every sampling period of a sampling signal, said latched comparator circuit comprising:
    a plurality of voltage comparing means, each having first and second output terminals and each supplied with said analog input signal and one of a plurality of different reference voltages, respectively, one of said plurality of voltage comparing means being selectively enabled that every sampling period of said sampling signal and said first and second output terminals, respectively, of said plurality of voltage comparing means being connected in common; and a latch circuit having first and second input terminals respectively connected to said first and second commonly connected outputs of said plurality of voltage comparing means for carrying out a latch operation in synchronism with the sampling period, an output terminal of said latch circuit being connected to one of said commonly connected output terminals of said plurality of voltage comparing means and providing an input signal to one of said first and second encoders.

8. Apparatus for converting an analog signal to an input signal for a digital encoder, the apparatus being of the kind having a voltage divider providing a plurality of different voltages, a plurality of voltage comparators each receiving the analog input signal and one of said plurality of different voltages and having commonly connected outputs, the apparatus comprising a voltage source, latched comparator means having inputs receiving said common outputs of said plurality of voltage comparators and producing outputs therefrom, resistive load means connected between said outputs of said latched comparator means and said voltage source, and switching means connected for selectivity enabling said latched comparator means, wherein a sampling signal is connected to selectively enable successive ones of said plurality of voltage comparators and is fed to said switching means for enabling said latched comparator means in response thereto, whereby outputs of said latched comparator means form said input signal to said digital encoder.

9. Apparatus according to claim 8, wherein said switching means comprise a pair of differentially connected transistors, common emitters thereof being connected through a current source to relative ground potential, bases of said transistor pair being connected to receive said sampling signal and a complement thereof, respectively, and a collector of one of said pair of transistors being connected to said voltage source and another of said collectors being connected to said latched comparator means for enabling same.

10. Apparatus according to claim 9, wherein said latched comparator means includes a latch circuit formed of a second pair of transistors, common emitters thereof being connected to said one of the collectors of said switching means, and collectors of said second pair of transistors being connected through said resistive load means to said voltage source, being connected to said common outputs of said plurality of voltage comparators, and being connected for forming said input signal to said digital encoder.

11. Apparatus according to claim 8, further comprising first and second transistors connected in cascade between said common outputs of said plurality of voltage comparators and said inputs of said latched comparator means.

* * * * *